US011075284B2

(12) United States Patent
Zhaomeng

(10) Patent No.: US 11,075,284 B2
(45) Date of Patent: Jul. 27, 2021

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Zhaomeng, Shanghai (CN)

(73) Assignees: Semiconductor Manufacturing (Shanghai) International Corporation, Shanghai (CN); Semiconductor Manufacturing (Beijing) International Corporation, Beijing (CN)

(*) Notice: Subject to any disclaimer, the term of this patent is extended or adjusted under 35 U.S.C. 154(b) by 0 days.

(21) Appl. No.: 16/863,215

(22) Filed: Apr. 30, 2020

(65) Prior Publication Data

US 2021/0159332 A1    May 27, 2021

(30) Foreign Application Priority Data

Nov. 21, 2019    (CN) .......................... 201911150860.2

(51) Int. Cl.

| H01L 29/66 | (2006.01) |
| H01L 29/10 | (2006.01) |
| H01L 29/08 | (2006.01) |
| H01L 29/06 | (2006.01) |

(Continued)

(52) U.S. Cl.
CPC ...... H01L 29/66681 (2013.01); H01L 21/266 (2013.01); H01L 21/26513 (2013.01);
(Continued)

(58) Field of Classification Search
CPC ........... H01L 29/7816; H01L 29/66681; H01L 29/7835; H01L 29/66659; H01L 29/1095;
(Continued)

(56) References Cited

U.S. PATENT DOCUMENTS

| 2003/0001198 A1* | 1/2003 | Bromberger ...... H01L 29/66659 257/327 |
| 2004/0251492 A1* | 12/2004 | Lin ................... H01L 29/66689 257/335 |

(Continued)

*Primary Examiner* — Errol V Fernandes
*Assistant Examiner* — Jeremy J Joy
(74) *Attorney, Agent, or Firm* — Brinks Gilson & Lione

(57) ABSTRACT

A semiconductor structure and a forming method thereof are provided. One form of the forming method includes: providing a base, where a well region and a drift region adjacent to the well region are formed in the base; forming a trench in the drift region; forming a diffusion barrier layer in the trench; after the diffusion barrier layer is formed, forming a gate structure on the base at a junction between the well region and the drift region, where the gate structure is located on a side of the diffusion barrier layer near the well region; and forming a source region in the well region on one side of the gate structure, and forming a drain region in the drift region on the other side of the gate structure, where the drain region is located on a side of the diffusion barrier layer in the drift region away from the well region. In embodiments and implementations of the present disclosure, during the operation of the semiconductor structure, under the barrier action of the diffusion barrier layer, doping ions in the drain region do not easily diffuse into the channel region below the gate structure, which makes a depletion layer of the source region and the drain region on two sides of the gate structure not easily expand, thereby being beneficial to alleviate the short-channel effect, and further improving the electrical performance of the semiconductor structure.

9 Claims, 4 Drawing Sheets

(51) Int. Cl.
 *H01L 21/762* (2006.01)
 *H01L 29/78* (2006.01)
 *H01L 21/266* (2006.01)
 *H01L 21/265* (2006.01)

(52) U.S. Cl.
 CPC .... *H01L 21/76237* (2013.01); *H01L 29/0634* (2013.01); *H01L 29/0653* (2013.01); *H01L 29/0865* (2013.01); *H01L 29/0882* (2013.01); *H01L 29/1083* (2013.01); *H01L 29/1095* (2013.01); *H01L 29/66659* (2013.01); *H01L 29/7816* (2013.01)

(58) Field of Classification Search
 CPC ............ H01L 29/0865; H01L 29/0882; H01L 29/0638–0653; H01L 29/063–0634; H01L 21/26513–2652; H01L 29/1083; H01L 21/76237
 See application file for complete search history.

(56) References Cited

U.S. PATENT DOCUMENTS

| | | | | |
|---|---|---|---|---|
| 2005/0104098 | A1* | 5/2005 | Yasuoka | H01L 29/7835 257/288 |
| 2007/0200184 | A1* | 8/2007 | Zhu | H01L 29/0653 257/409 |
| 2007/0221965 | A1* | 9/2007 | Miller | H01L 21/2253 257/288 |
| 2008/0290411 | A1* | 11/2008 | Lee | H01L 29/66606 257/343 |
| 2011/0133279 | A1* | 6/2011 | Cha | H01L 29/7835 257/343 |
| 2012/0061756 | A1* | 3/2012 | Ibi | H01L 29/66681 257/335 |
| 2012/0199878 | A1* | 8/2012 | Shrivastava | H01L 29/665 257/192 |
| 2012/0228703 | A1* | 9/2012 | Yamaoka | H01L 29/0878 257/335 |
| 2012/0261750 | A1* | 10/2012 | Yamashina | H01L 29/0847 257/335 |
| 2014/0061787 | A1* | 3/2014 | Kim | H01L 29/66689 257/339 |
| 2014/0091389 | A1* | 4/2014 | Hsu | H01L 29/7816 257/335 |
| 2014/0339636 | A1* | 11/2014 | Hsu | H01L 27/088 257/343 |
| 2015/0179792 | A1* | 6/2015 | Sridhar | H01L 29/66659 257/336 |
| 2015/0364598 | A1* | 12/2015 | Jung | H01L 29/7835 257/343 |
| 2019/0148543 | A1* | 5/2019 | Kojima | H01L 29/0634 257/335 |

* cited by examiner

SEMICONDUCTOR STRUCTURE AND FORMING METHOD THEREOF

RELATED APPLICATIONS

The present application claims priority to Chinese Patent Appln. No. 201911150860.2, filed Nov. 21, 2019, the entire disclosure of which is hereby incorporated by reference.

BACKGROUND

Technical Field

Embodiments and implementations of the present disclosure relate to the field of semiconductor manufacturing, and in particular to a semiconductor structure and a forming method thereof.

Related Art

In the development of power integrated circuits, a single-chip manufacturing process developed to integrate a power switch and a control circuit, especially a lateral double diffusion MOS (LDMOS) manufacturing process currently for manufacturing a monolithic integrated circuit is a mainstream trend. The LDMOS manufacturing process is to perform planar diffusion on a surface of a semiconductor base plate so as to form a lateral main current path. Since an LDMOS is manufactured using a typical IC manufacturing process, the control circuit and the LDMOS can be integrated on a monolithic power IC. By adopting reduced surface electric field (RESURE) technology and a low thickness epitaxy (BPI) or N-well region, the LDMOS manufacturing process can achieve the objects of high voltage and low on-resistance.

An LDMOS device is a field-effect transistor (FET) device similar to a traditional field-effect transistor (FET) device, both including: forming a pair of source/drain regions separated by a channel region in a semiconductor substrate, and sequentially forming a gate electrode above the channel region. However, the LDMOS device is different from the traditional FET device in that in the traditional FET device, the pair of source/drain regions are made symmetric to the gate electrode, while in the LDMOS device the drain region is farther from the gate electrode than the source region and the drain region is simultaneously formed in a doped well (having the same polarity as the drain region) for separating the channel region from the drain region.

SUMMARY

The problem to be addressed in embodiments and implementations of the present disclosure is to provide a semiconductor structure and a forming method thereof to improve the electrical performance of the semiconductor structure.

To address the foregoing problem, one form of the present disclosure provides a semiconductor structure, including: a base, where the base has a well region and a drift region adjacent to each other therein; a gate structure, located on the base at a junction between the well region and the drift region; a source region, located in the well region on one side of the gate structure; a drain region, located in the drift region on the other side of the gate structure; and a diffusion barrier layer, located in the drift region between the drain region and the gate structure, where the diffusion barrier layer is configured to prevent doping ions in the drain region from diffusing into a channel region below the gate structure.

Another form of the present disclosure further provides a forming method of a semiconductor structure. One form of a method includes: providing a base, where a well region and a drift region adjacent to each other are formed in the base; forming a trench in the drift region; forming a diffusion barrier layer in the trench; after the diffusion barrier layer is formed, forming a gate structure on the base at a junction between the well region and the drift region, where the gate structure is located on a side of the diffusion barrier layer near the well region; and forming a source region in the well region on one side of the gate structure, and forming a drain region in the drift region on the other side of the gate structure, where the drain region is located on a side of the diffusion barrier layer in the drift region away from the well region.

Compared with the prior art, the technical solutions of embodiments and implementations the present disclosure have the following advantages:

In the semiconductor structure of some implementations of the present disclosure, the base has the well region and the drift region adjacent to each other therein, the gate structure is located on the base at the junction between the well region and the drift region, the source region is located in the well region on one side of the gate structure, the drain region is located in the drift region on the other side of the gate structure, the diffusion barrier layer is located in the drift region between the drain region and the gate structure, and the diffusion barrier layer is configured to prevent the doping ions in the drain region from diffusing into the channel region below the gate structure. During the operation of the semiconductor structure, under the action of the diffusion barrier layer, the doping ions in the drain region do not easily diffuse into the channel region below the gate structure, which makes a depletion layer of the drain region not easily expand, thereby being beneficial to alleviate the short-channel effect, and further improving the electrical performance of the semiconductor structure.

DETAILED DESCRIPTION

As can be known from the related art, currently formed semiconductor structures have a problem of poor electrical performance. The reasons why the performance of current semiconductor structures are poor are now analyzed in combination with a forming method of a semiconductor structure.

Figure 1:
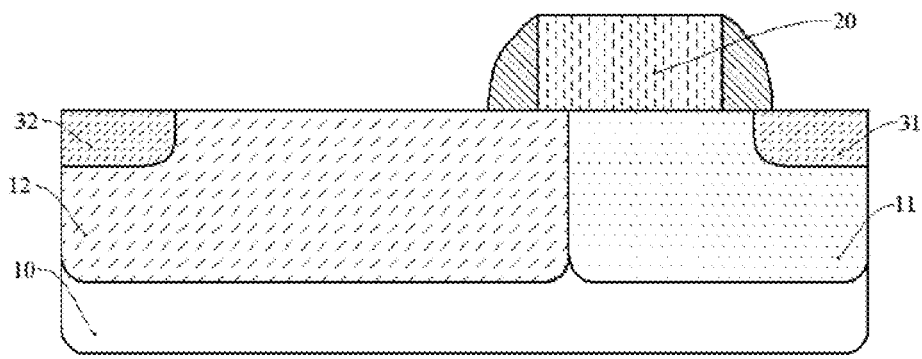
FIG. 1 is a schematic structural diagram of a semiconductor structure.

With reference to FIG. 1, a schematic structural diagram of a semiconductor structure is shown.

The semiconductor structure shows a design of an LDMOS. The semiconductor structure includes: a substrate (not shown) and a fin 10 located on the substrate, where the fin 10 has a well region 11 and a drift region 12 adjacent to each other therein; a gate structure 20, spanning the fin 10 at a junction between the well region 11 and the drift region 12, and covering a partial top wall and a partial side wall of the fin 10; a source region 31, located in the well region 11 on one side of the gate structure 20; and a drain region 32, located in the drift region 12 on the other side of the gate structure 20 and isolated from the gate structure 20.

Taking an N-type lateral double diffusion MOS field-effect transistor (NLDMOS) as an example, during the operation of a device, carriers flow out of the drain region 32, pass through the drift region 12 between the drain region 32 and the gate structure 20, and flow to a channel below the gate structure 20. Generally, the drain region 32 has N-type ions (i.e., phosphorus ions, arsenic ions or antimony ions) therein for improving the carrier mobility. However, doping ions in the drain region 32 easily diffuse into a channel region below the gate structure 20. During the operation of the semiconductor structure, a depletion layer of the drain region 32 easily expands, so that the short-channel effect is severe, resulting in poor electrical performance of the semiconductor structure.

To address the foregoing technical problems, one form of the present disclosure provides a semiconductor structure, including: a base, where the base has a well region and a drift region adjacent to each other therein; a gate structure, located on the base at a junction between the well region and the drift region; a source region, located in the well region on one side of the gate structure; a drain region, located in the drift region on the other side of the gate structure; and a diffusion barrier layer, located in the drift region between the drain region and the gate structure, where the diffusion barrier layer is configured to prevent doping ions in the drain region from diffusing into a channel region below the gate structure.

In the semiconductor structure of one form of the present disclosure, the base has the well region and the drift region adjacent to each other therein, the gate structure is located on the base at the junction between the well region and the drift region, the source region is located in the well region on one side of the gate structure, the drain region is located in the drift region on the other side of the gate structure, the diffusion barrier layer is located in the drift region between the drain region and the gate structure, and the diffusion barrier layer is configured to prevent the doping ions in the drain region from diffusing into the channel region below the gate structure. During the operation of the semiconductor structure, under the action of the diffusion barrier layer, the doping ions in the drain region do not easily diffuse into the channel region below the gate structure, which makes a depletion layer of the drain region not easily expand, thereby being beneficial to alleviate the short-channel effect, and further improving the electrical performance of the semiconductor structure.

In order to make the foregoing objects, features and advantages of the implementations of the present disclosure more comprehensible, specific embodiments and implementations of the present disclosure will be described in detail below in conjunction with the accompanying drawings.

FIG. 2 to FIG. 10 show schematic structural diagrams corresponding to steps in one form of a forming method of a semiconductor structure according the present disclosure. The forming method of the semiconductor structure provided by one form of the present disclosure will be described in detail below in conjunction with the accompanying drawings.

Figure 2:
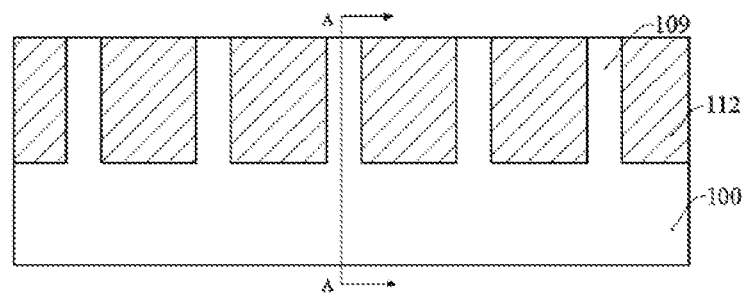
FIG. 2 to FIG. 10 are schematic structural diagrams corresponding to steps in one form of a forming method of a semiconductor structure according to the present disclosure.
Figure 3:
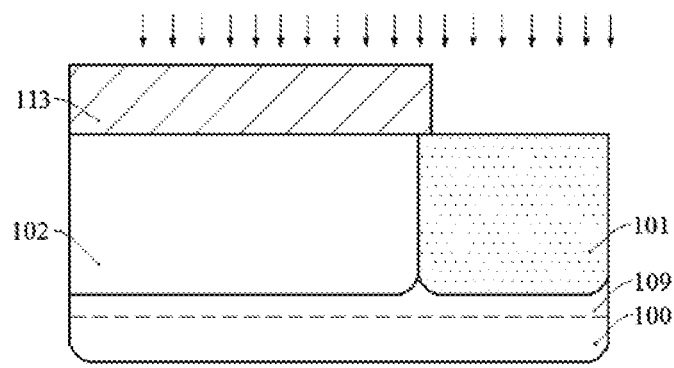
Figure 4:
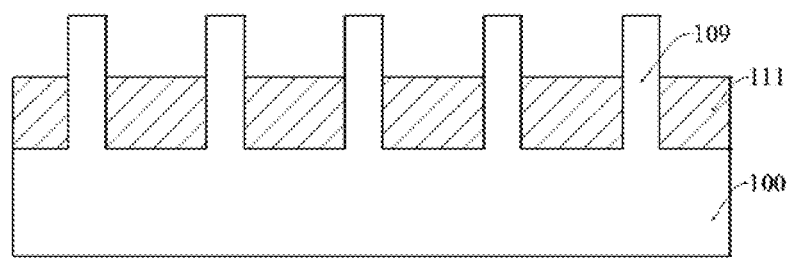

With reference to FIG. 2 to FIG. 4, FIG. 3 is a cross-sectional view of FIG. 2 taken along line AA, and FIG. 4 is a cross-sectional view based on FIG. 2. A base is provided. A well region 101 (as shown in FIG. 3) and a drift region 102 (as shown in FIG. 3) adjacent to each other are formed in the base.

The base is configured to provide a process platform for forming an LDMOS subsequently.

In some implementations, the base includes a substrate 100 and a fin 109 located on the substrate 100.

In some implementations, taking an LDMOS fin field-effect transistor as the semiconductor structure as an example, the base includes a substrate 100 and fins 109 discrete on the substrate 100. In other implementations, the LDMOS may also be a planar transistor, and a corresponding base is a plane substrate.

In some implementations, the substrate 100 is a silicon substrate. In other implementations, the substrate may also be a substrate of another material such as a germanium substrate, a silicon-germanium substrate, a silicon carbide substrate, a gallium arsenide substrate, an indium-gallium substrate or the like, and the substrate may also be another type of substrate such as a silicon substrate on an insulator, a germanium substrate on an insulator or the like.

In some implementations, the fin 109 and the substrate 100 are of an integrated structure. In other implementations, the fin also may be a semiconductor layer epitaxially grown on the substrate, thereby achieving the object of accurately controlling an initial fin height.

Therefore, a material of the fin 109 is the same as a material of the substrate 100, and the material of the fin 109 is silicon. In other implementations, the material of the fin may also be a semiconductor material such as germanium, silicon-germanium, silicon carbide, gallium arsenide, indium-gallium or the like, and the material of the fin may also be different from the material of the substrate.

The drift region 102 has first type ions therein, the well region 101 has second type ions therein, and the first type ions have a conductivity type different from that of the second type ions.

Specifically, the well region 101 and the drift region 102 are formed in the fin 109, and the well region 101 is in contact with the drift region 102. The well region 101 is used as a lateral diffusion region to form a channel having a concentration gradient, and the drift region 102 is configured to receive a larger partial pressure.

Specifically, in some implementations, when the semiconductor structure is configured to form an NLDMOS, the first type ions are N-type ions, the N-type ions include one or more of phosphorus ions, arsenic ions and antimony ions, the second type ions are P-type ions, and the P-type ions include one or more of boron ions, gallium ions and indium ions.

When the semiconductor structure is configured to form a PLDMOS, the first type ions are P-type ions, the P-type ions include one or more of boron ions, gallium ions and indium ions, the second type ions are N-type ions, and the N-type ions include one or more of phosphorus ions, arsenic ions and antimony ions.

Specifically, the step of forming the well region 101 and the drift region 102 includes: forming an isolation material layer 112 covering the substrate 100 and a side wall of the fin 109; removing the isolation material layer 112 higher than a top of the fin 109 by adopting a planarization process; after the isolation material layer 112 higher than the top of the fin 109 is removed, forming a first implantation mask layer (not shown), where the first implantation mask layer exposes the fin 109 where the drift region 102 is to be formed; doping the fin 109 exposed by the first implantation mask layer with the first type ions to form the drift region 102; after the drift region 102 is formed, forming a second implantation mask layer 113 covering the drift region 102 and exposing a partial region of the fin 109, where the second implantation mask layer 113 exposes the fin 109 where the well region is to be formed; and doping the fin 109 exposed by the second implantation mask layer 113 with the second type ions to form the well region 101.

In some implementations, the drift region 102 is formed first, and then the well region 101 is formed. In other implementations, the well region may be formed first, and then the drift region may be formed.

In some implementations of the present disclosure, the fin 109 exposed by the first implantation mask layer is doped with the first type ions by adopting an ion implantation manner to form the drift region 102. The ion implantation has the characteristics of simple operation, low process cost and the like.

In some implementations of the present disclosure, the fin 109 exposed by the second implantation mask layer 113 is doped with the second type ions by adopting an ion implantation manner to form the well region 101. The ion implantation has the characteristics of simple operation, low process cost and the like.

In some implementations, the first implantation mask layer and the second implantation mask layer 113 are respectively used as implantation masks for forming the well region 101 and the drift region 102.

The first implantation mask layer and the second implantation mask layer 113 are materials that can function as a mask and are easy to remove, so that when the first implantation mask layer and the second implantation mask layer 113 are removed, damage to other film layer structures is reduced.

In some implementations, a material of the first implantation mask layer and the second implantation mask layer 113 is an organic material, for example, a bottom anti-reflective coating (BARC) material, an organic dielectric layer (ODL) material, spin on carbon (SOC), a photoresist, a dielectric anti-reflective coating (DARC) material, a deep UV light absorbing oxide (DUO) material or an advanced patterning film (APF) material.

The forming method of a semiconductor structure includes: after the well region 101 is formed, the second implantation mask layer 113 is removed.

In some implementations of the present disclosure, the isolation material layer 112 covers the side wall of the fin 109 and the substrate 100. Therefore, during the formation of the well region 101 and the drift region 102 by adopting the ion implantation manner, the isolation material layer 112 protects the substrate 100 and the fin 109 to avoid damage to the substrate 100 and the fin 109.

As shown in FIG. 4, the forming method of a semiconductor structure further includes: after the drift region 102 and the well region 101 are formed, a partial thickness of the isolation material layer 112 is etched back to form an isolation layer 111.

The isolation layer 111 is configured to isolate the adjacent fins 109.

In some implementations, a material of the isolation layer 111 is silicon oxide. The silicon oxide is a low-cost dielectric material commonly used in the process, and has higher process compatibility, which is beneficial to reduce the process difficulty and process cost of forming the isolation layer 111. In addition, the silicon oxide has a smaller permittivity, which is beneficial to improve the effect of isolating adjacent devices subsequently.

Figure 5:
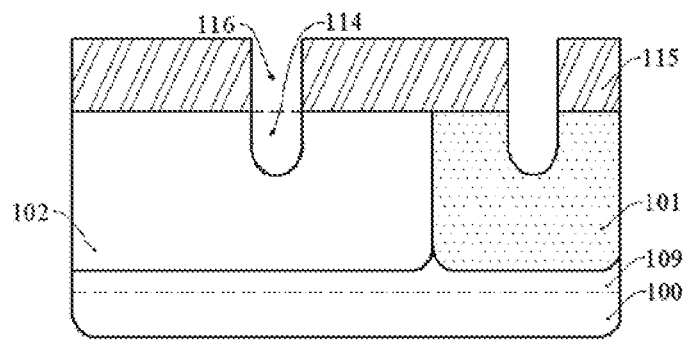

With reference to FIG. 5, a trench 114 is formed in the drift region 102.

The trench 114 provides a space for forming the diffusion barrier layer subsequently.

In some implementations, the drift region 102 is etched by a dry etching process such that the trench 114 is formed in the drift region 102. The dry etching process has the characteristic of anisotropic etching and has good control of the etching profile, which is beneficial to make the appearance of the trench 114 meet the process requirements. In addition, the adoption of the dry etching process is beneficial to accurately control a depth of the trench 114.

It should be noted that during the formation of the trench 114 in the drift region 102, the trench 114 is also formed in the well region 101.

In some implementations, the step of forming the trench 114 includes: forming a mask layer 115 on the base, where the mask layer 115 has an opening 116 therein, and the opening 116 exposes a region where the trench is to be formed; and etching the drift region 102 and the well region 101 by using the mask layer 115 as a mask such that the trench 114 is formed in the drift region 102 and the well region 101, respectively.

Specifically, the mask layer 115 is formed on the drift region 102 and the well region 101.

The mask layer 115 is a material that can function as a mask and is easy to remove, so that when the mask layer 115 is removed subsequently, damage to other film layer structures is reduced.

In some implementations, a material of the mask layer 115 is an organic material, for example, a bottom anti-reflective coating (BARC) material, an organic dielectric layer (ODL) material, spin on carbon (SOC), a photoresist, a dielectric anti-reflective coating (DARC) material, a deep UV light absorbing oxide (DUO) material or an advanced patterning film (APF) material.

The step of forming the mask layer 115 includes: forming a mask material layer (not shown) covering the base; and patterning the mask material layer such that the opening 116 is formed in the mask material layer and the remaining mask material layer is used as the mask layer 115.

In some implementations, the mask material layer is formed by adopting a spin coating process.

The subsequent forming process of a semiconductor structure further includes: forming a gate structure on the base at a junction between the well region 101 and the drift region 102, where the gate structure is located between the trench 114 in the drift region 102 and the trench 114 in the well region 101; and after the gate structure is formed, forming a drain region in the drift region 102, where the drain region is located on a side of the trench 114 in the drift region 102 away from the well region 101, and forming a source region in the well region 101, where the source region is located on a side of the trench 114 in the well region 101 away from the drift region 102.

It should be noted that the trench 114 should not be too deep or too shallow. Generally, the source region and the drain region are formed in the same step. A bottom end of the source region and a bottom end of the drain region have approximately a same height in the fin 109. If the trench 114 is too deep, during the operation of the semiconductor structure, a path of a current flowing from the drain region through the channel and the source region becomes larger, which causes an on-resistance of the semiconductor structure to increase, thereby causing an on-current to decrease and making it difficult to improve the electrical performance of the semiconductor structure. If the trench 114 is too shallow, the first type ions in the drain region may still diffuse from a bottom end of the diffusion barrier layer to the channel region below the gate structure, so that during the operation of the semiconductor structure, a depletion layer of the drain region easily expands, which is not beneficial to alleviate the short-channel effect. If the trench is only slightly lower than the bottom end of the drain region, a stress of the diffusion barrier layer 106 on the source region and the drain region is small, so that it is difficult to significantly improve the carrier mobility in the channel. In some implementations, in the step of forming the trench 114, a bottom end of the trench 114 is lower than the bottom end of the drain region formed subsequently by 10 nm to 20 nm, and "lower" means that the bottom end of the trench 114 is located below the bottom end of the drain region.

It should be noted that with a direction perpendicular to an extension direction of the gate structure as a lateral direction, a lateral dimension of the trench 114 should not be too large or too small. The trench 114 is formed in the diffusion barrier layer subsequently, and a material of the diffusion barrier layer is a high-stress dielectric material. If the lateral dimension of the diffusion barrier layer is too large, the stress of a top of the diffusion barrier layer 106 on the source region and the drain region subsequently formed is too large, which may easily cause fracture or dislocation in the source region and the drain region. On the one hand, this may easily cause a leakage current in the source region and the drain region. On the other hand, during the operation of the semiconductor structure, excessive heat is easily generated at the fracture or dislocation in the source region and the drain region, resulting in poor performance of the semiconductor structure. In addition, since the material of the diffusion barrier layer 106 is a dielectric material, the too large lateral dimension of the diffusion barrier layer 106 easily causes the on-resistance of the semiconductor structure to increase and the on-current to decrease, making it difficult to improve the electrical performance of the semiconductor structure. If the lateral dimension of the trench 114 is too small, the first type ions in the source region and the drain region easily pass through the diffusion barrier layer and diffuse into the channel region. During the operation of the semiconductor structure, this causes the depletion layer of the source region and the drain region to easily expand, making it difficult to alleviate the short-channel effect. In some implementations, in the step of forming the trench 114, the lateral dimension of the trench 114 is 20 nm to 30 nm.

Figure 6:
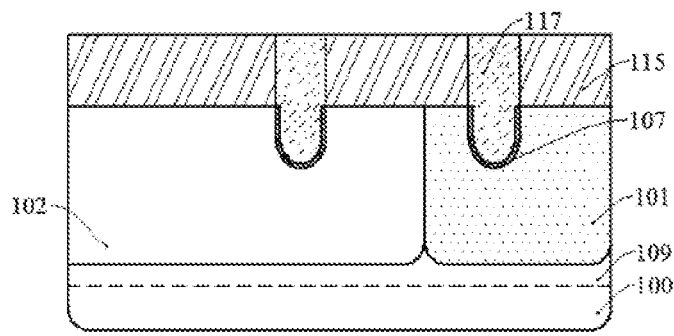
Figure 7:
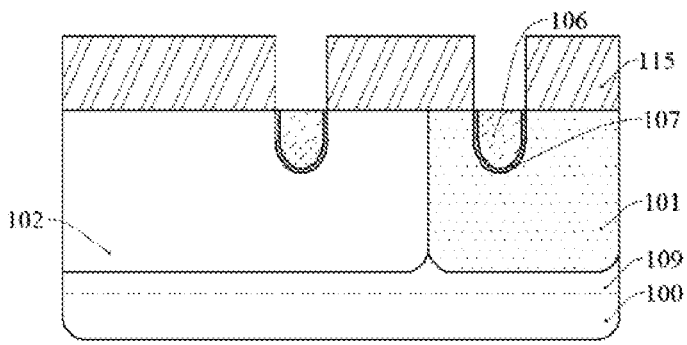

With reference to FIG. 6 to FIG. 7, the diffusion barrier layer 106 (as shown in FIG. 7) is formed in the trench 114.

In some implementations of the present disclosure, the base has the well region 101 and the drift region 102 adjacent to each other therein. Subsequently, the gate structure is formed on the base at the junction of the well region 101 and the drift region 102, and the drain region is formed in the drift region 102. The drain region is located on the side of the trench 114 in the drift region 102 away from the well region 101. The diffusion barrier layer 106 is located in the drift region 102 between the drain region and the gate structure. The diffusion barrier layer 106 is configured to prevent doping ions in the drain region from diffusing into the channel region below the gate structure. During the operation of the semiconductor structure, under the action of the diffusion barrier layer 106, the doping ions in the drain region do not easily diffuse into the channel region below the gate structure, which makes the depletion layer of the source region and the drain region on two sides of the gate structure not easily expand, thereby being beneficial to alleviate the short-channel effect, and further improving the electrical performance of the semiconductor structure.

It should be noted that the diffusion barrier layer 106 is also formed in the trench 114 in the well region 101. Therefore, the diffusion barrier layer 106 in the well region 101 is configured to prevent the first type ions in the source region from diffusing into the channel region below the gate structure 103.

In some implementations, the material of the diffusion barrier layer 106 includes silicon nitride. The silicon nitride has a high density, which makes it difficult for the first type ions in the drain region to pass through the diffusion barrier layer 106 and diffuse into the channel region. Moreover, the silicon nitride is a low-cost dielectric material commonly used in the process, and has higher process compatibility, which is beneficial to reduce the process difficulty and process cost of forming the diffusion barrier layer 106. In other implementations, the material of the diffusion barrier layer may also be diamond-like carbon. The diamond-like carbon has a high density and can also make the first type ions in the drain region diffuse into the channel region.

It should also be noted that the diffusion barrier layer 106 can also provide a stress to the drain region, which can improve the carrier mobility in the channel during the operation of the semiconductor structure.

In some implementations, the semiconductor structure is an NLDMOS, the diffusion barrier layer 106 is used to provide a tensile stress to the source region and the drain region, and stretching the channel can improve the electron mobility. In other implementations, the semiconductor structure is a PLDMOS, the diffusion barrier layer is configured to provide a compression stress to the source region and the drain region, and compressing the channel can improve the hole mobility.

In some implementations, the material of the diffusion barrier layer 106 includes silicon nitride. The silicon nitride is a high-stress material, which can provide a stress to the drain region, and can improve the carrier mobility in the channel during the operation of the semiconductor structure. In other implementations, the material of the diffusion barrier layer is diamond-like carbon. The diamond-like carbon is a high-stress material, which can also provide a stress to the drain region, and can improve the carrier mobility in the channel during the operation of the semiconductor structure.

The step of forming the diffusion barrier layer 106 includes: forming a diffusion barrier material layer 117 (as shown in FIG. 6) in the trench 114 and the opening 116; removing the diffusion barrier material layer 117 higher than the opening 116 by adopting a planarization process; and after the planarization process is performed, etching back a partial thickness of the diffusion barrier material layer 117 such that the remaining diffusion barrier material layer 117 located in the trench 114 is used as the diffusion barrier layer 106.

In some implementations, the diffusion barrier material layer 117 is formed by adopting a high-density plasma chemical vapor deposition (HDPCVD) process. The high-density plasma chemical vapor deposition process enables the deposition process to be applied at a low temperature (250° C. to 450° C.). During the process, deposition and etching can be synchronously performed in a same reaction chamber. The process has better high aspect ratio gap filling capacity, good deposition film, strong adhesion to silicon wafer, higher deposition rate, and fewer deposition defects such as voids or pinholes, is beneficial to improve a density of the diffusion barrier material layer 117, and is accordingly beneficial to improve the stress of the diffusion barrier layer 106 on the channel. In other implementations, the diffusion barrier material layer may also be formed by adopting an atomic layer deposition process.

The forming method of a semiconductor structure may further include: after the diffusion barrier layer 106 is formed, removing the mask layer 115.

In some implementations, the mask layer 115 is removed by adopting an ashing process.

It should be noted that with reference to FIG. 6, the forming method of a semiconductor structure further includes: after the trench 114 is formed and before the diffusion barrier layer 106 is formed in the trench 114, forming an inversion layer 107 on a side wall and a bottom wall of the trench 114. The inversion layer 107 is doped with the second type ions, and the second type ions have a conductivity type different from that of the first type ions.

The conductivity type of the second type ions is different from the conductivity type of the first type ions, and the inversion layer 107 makes the first type ions in the source region and the drain region not easily diffuse into a surface of the diffusion barrier layer 106, so that during the operation of the semiconductor structure, the side wall and bottom of the diffusion barrier layer 106 are not liable to the phenomenon of a leakage current. In addition, a laminated structure formed of the diffusion barrier layer 106 and the inversion layer 107 makes the first type ions in the source region and the drain region not easily diffuse into the channel region, and therefore, during the operation of the semiconductor structure, the depletion layer of the source region and the drain region does not easily expand, thereby being beneficial to alleviate the short-channel effect, and further being beneficial to improve the electrical performance of the semiconductor structure.

In some implementations, the step of forming the inversion layer 107 includes: forming an epitaxial layer (not shown) in the trench 114 by adopting a selective epitaxial growth (SEG) process, and during the formation of the epitaxial layer, doping the epitaxial layer with the second type ions.

The epitaxial layer formed by the selective epitaxial growth process has high purity, fewer growth defects and high formation quality. In other implementations, the epitaxial layer may also be formed by adopting an atomic layer deposition process, a chemical vapor deposition process or a low-pressure furnace tube process.

In some implementations, the epitaxial layer is subjected to ion doping by adopting an in-situ self-doping process to form the inversion layer 107. The adoption of the in-situ self-doping manner is beneficial to improve the uniformity of a doping ion concentration in the inversion layer 107, thereby improving the quality and performance of the inversion layer 107. In other implementations, the epitaxial layer may also be subjected to ion doping by adopting an ion implantation manner after the epitaxial layer is formed so as to form the inversion layer.

Specifically, a material of the epitaxial layer includes silicon carbide, silicon or silicon-germanium. In some implementations, the material of the epitaxial layer includes silicon. The inversion layer 107 is formed by the selective epitaxial growth process, and the material of the fin 109 is silicon, which is beneficial to improve the formation quality of the epitaxial layer.

In some implementations, the semiconductor structure is an NLDMOS, the second type ions are P-type ions, and the P-type ions include boron ions, gallium ions or indium ions.

In other implementations, the semiconductor structure is a PLDMOS, the second type ions are N-type ions, and the N-type ions include phosphorus ions, arsenic ions or antimony ions.

It should be noted that the inversion layer 107 should not be too thick or too thin. The main material of the inversion layer 107 is silicon which has a density lower than that of silicon nitride. If the inversion layer 107 is too thick, the inversion layer 107 will occupy too much space of the diffusion barrier layer 106, so that the space for forming the diffusion barrier layer 106 is small, resulting in a weaker barrier capability of the laminated structure formed of the inversion layer 107 and the diffusion barrier layer 106 to the first type ions, and accordingly, easily resulting in an insufficient stress of the diffusion barrier layer 106 on the drain region and making it difficult to improve the carrier mobility in the channel. If the inversion layer 107 is too thin, when the first type ions in the source region and the drain region diffuse into the inversion layer 107, the second type ions in the inversion layer 107 are easily electrically neutralized with the first type ions, so that the first type ions in the drain region diffuse into the surface of the diffusion barrier layer 106, resulting in the phenomenon of a leakage current in the side wall and the bottom of the diffusion barrier layer 106 in the well region 101. In some implementations, a thickness of the inversion layer 107 is 5 nm to 10 nm.

It should be noted that the forming method of a semiconductor structure further includes: after the diffusion barrier layer 106 is formed and before the gate structure is formed, annealing the diffusion barrier layer 106.

The annealing makes the diffusion barrier layer 106 denser, so that the diffusion barrier layer 106 can provide a larger stress to the source region and the drain region formed subsequently.

In some implementations, the diffusion barrier layer 106 is annealed by adopting spike annealing. In other implementations, the diffusion barrier layer may also be annealed by adopting a laser annealing process.

Figure 8:
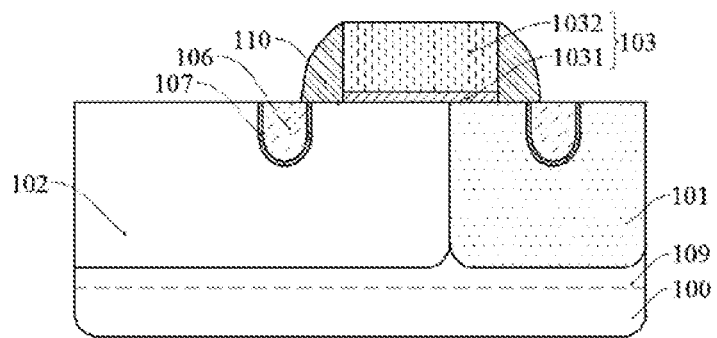

With reference to FIG. 8, after the diffusion barrier layer 106 is formed, the gate structure 103 is formed on the base at the junction between the well region 101 and the drift region 102. The gate structure 103 is located on a side of the diffusion barrier layer 106 near the well region 101.

In the base, the channel region is formed in a region covered by the gate structure 103. Specifically, in the fin 109, the region covered by the gate structure 103 is used as the channel region.

In some implementations, the gate structure 103 is configured to control the on and off of the LDMOS channel.

Specifically, the gate structure 103 spans the fin 109 and covers a partial top wall and a partial side wall of the fin 109.

Since the LDMOS is a high-voltage device, the gate structure 103 includes: a gate dielectric layer 1031, located on a surface of the fin 109 at the junction between the well region 101 and the drift region 102; and a gate layer 1032, located on the gate dielectric layer 1031.

In some implementations, the gate structure 103 is a poly gate structure. Accordingly, a material of the gate dielectric layer 1031 is silicon oxide. A material of the gate layer 1032 is polysilicon.

In some implementations, the semiconductor structure further includes: a side wall covering 110 formed on a side wall of the gate structure 103. During the formation of the semiconductor structure, the side wall covering 110 protects the side wall of the gate structure 103.

In some implementations, a material of the side wall covering 110 includes one or more of silicon nitride, silicon oxynitride, silicon carbide, silicon carbide nitride, boron nitride, silicon boron nitride or silicon carbon boron nitride.

Figure 9:
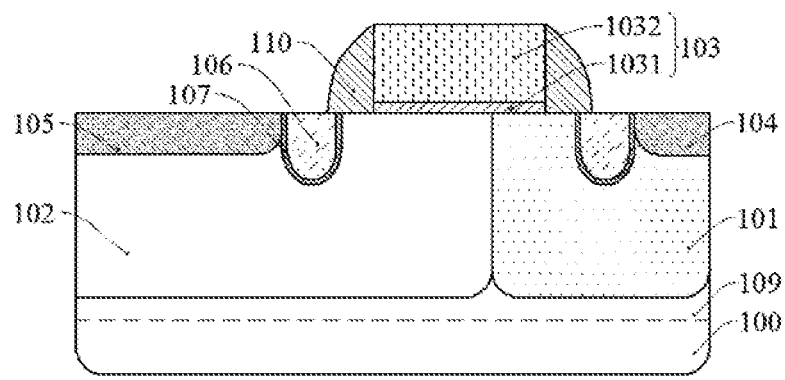

With reference to FIG. 9, the source region 104 is formed in the well region 101 on one side of the gate structure 103, and the drain region 105 is formed in the drift region 102 on the other side of the gate structure. The drain region 105 is located on the side of the diffusion barrier layer 106 in the drift region 102 away from the well region 101.

During the operation of the semiconductor structure, the source region 104 and the drain region 105 are configured to provide a stress to the channel so as to improve the carrier mobility in the channel.

In some implementations, doping ions in the drain region 105 and the source region 104 and doping ions in the drift region 102 have a same conductivity type, and are both the first type ions.

Specifically, the step of forming the drain region 105 and the doped region 106 includes: forming a shielding layer (not shown) on the drift region 102 and the well region 101, where the shielding layer covers the diffusion barrier layer 106; and by using the shielding layer as a doping mask, forming the drain region 105 in the drift region 102, and forming the source region 104 in the well region 101.

By using the shielding layer as the doping mask for forming the source region 104 and the drain region 105, during the formation of the source region 104 and the drain region 105 by doping, the probability that the diffusion barrier layer 106 is doped is reduced, so that the diffusion barrier layer 106 can better prevent the first type ions in the source region 104 and the drain region 105 from diffusing into the channel region.

The shielding layer is a material that can function as a mask and is easy to remove, so that when the shielding layer is removed subsequently, damage to other film layer structures is reduced.

In some implementations, a material of the shielding layer is an organic material, for example, a BARC material, an ODL material, an SOC material, a photoresist, a DARC material, a DUO material or an APF material.

The forming method of a semiconductor structure further includes: after the source region 104 and the drain region 105 are formed, removing the shielding layer.

It should be noted that in some implementations, in the step of forming the trench 114 (as shown in FIG. 5), the bottom end of the trench 114 is lower than the bottom end of the drain region formed subsequently by 10 nm to 20 nm, and therefore, the bottom end of the drain region 105 is higher than the bottom end of the diffusion barrier layer 106 by 10 nm to 20 nm.

Figure 10:
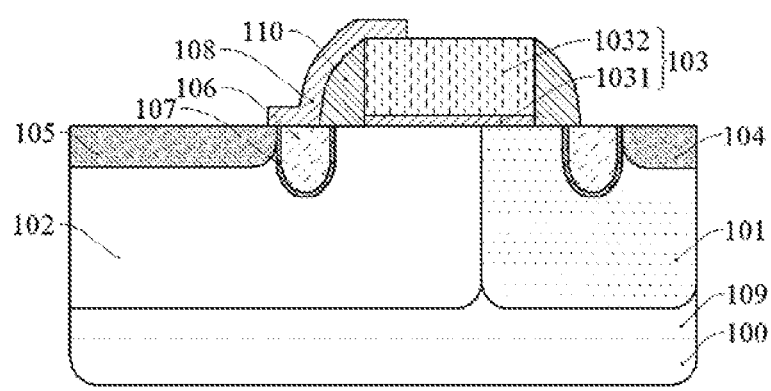

With reference to FIG. 10, after the source region 104 and the drain region 105 are formed, a salicide barrier layer 108 is formed on the drift region 102 between the gate structure 103 and the drain region 105. The salicide barrier layer 108 extends onto a sidewall and a partial top in the gate structure 103 near the drain region 105.

In some implementations of the present disclosure, the source region 104 and the drain region 105 are formed first, and then the salicide barrier layer 108 is formed. During the formation of the salicide barrier layer 108, the salicide barrier layer 108 can accurately cover the diffusion barrier layer 106 and a partial region in the drain region 105 near the gate structure 103, so that a metal salicide layer formed subsequently cannot easily contact the diffusion barrier layer 106, thereby avoiding the problem of tip leakage in the semiconductor structure. Moreover, since the source region 104 and the drain region 105 are formed prior to the salicide barrier layer 108, the source region 104 and the drain region 105 are configured for a larger process window, so that a region formed by the source region 104 and the drain region 105 is large, and therefore, a contact resistance of the semiconductor structure is small.

It should be noted that the salicide barrier layer 108 also extends onto a partial region in the drain region 105 near the gate structure 103.

The salicide barrier layer 108 is configured to prevent the growth of a salicide layer, thereby preventing the salicide layer from being formed on the drift region 102 between the gate structure 103 and the drain region 105, preventing the salicide layer from adversely affecting the formation of a depletion region in the drift region 102, and further ensuring the withstanding voltage performance of the NLDMOS.

Specifically, a material of the salicide barrier layer 108 includes one or more of silicon oxide, silicon nitride and silicon oxynitride. In the some implementations, the material of the salicide barrier layer 108 is silicon oxide.

It should also be noted that in some implementations, in the forming method of a semiconductor structure, the source region 104 and the drain region 105 are formed first, and then the salicide barrier layer 108 is formed.

In other implementations, the salicide barrier layer may be formed first, and then the source region and the drain region may be formed. The salicide barrier layer formed first can function as a mask during the subsequent formation of the source region and the drain region. Therefore, during the formation of the source region and the drain region by doping, the first type ions cannot easily enter the drift region between the gate structure and the drain region under the shield of the salicide barrier layer, so that the first type ions cannot easily diffuse into the channel region, and the depletion layer of the source region and the drain region cannot easily expand during the operation of the semiconductor structure, which is beneficial to alleviate the short-channel effect and enhance the electrical performance of the semiconductor structure.

Figure 11:
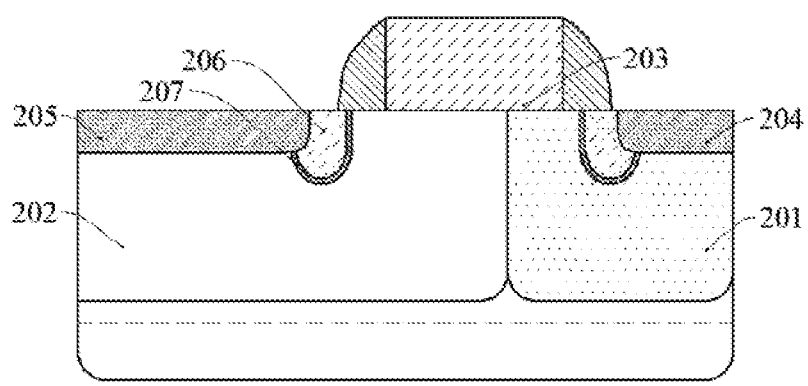
FIG. 11 and FIG. 12 are schematic structural diagrams corresponding to steps in another form of a forming method of a semiconductor structure according to the present disclosure.
Figure 12:
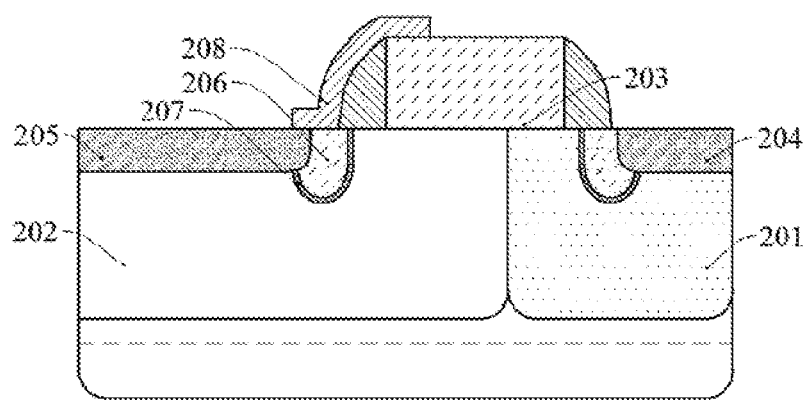

FIG. 11 and FIG. 12 show schematic structural diagrams corresponding to steps in one form of a forming method of a semiconductor structure according to some implementations of the present disclosure. The similarities of implementations described below to implementations described above are omitted here. The implementations described below are different from the implementations described above in that:

With reference to FIG. 11, a shielding layer (not shown) exposes a partial region in a diffusion barrier layer 206 of a drift region 202 away from a gate structure 203. Accordingly, during the formation of a drain region 205 using the shielding layer as a doping mask, the partial region in the diffusion barrier layer 206 of the drift region 202 away from the gate structure 203 forms the drain region 205.

The drain region 205 will occupy a partial region of the diffusion barrier layer 206 in the drift region 202 and a partial region of an inversion layer 207, the remaining inversion layer 207 is only formed between the diffusion barrier layer 206 and the drift region 202, and the drain region 205 is in direct contact with the diffusion barrier layer 206. The diffusion barrier layer 206 enables the drain region 205 to obtain a greater stress while preventing first type ions in the drain region 205 from diffusing into a channel region, which is beneficial to improve the carrier mobility in a channel during the operation of the semiconductor structure.

In some implementations, the shielding layer also exposes a partial region in the diffusion barrier layer 206 of the well region 201 away from the gate structure 203. Accordingly, during the formation of the source region 204 using the shielding layer as a doping mask, the partial region in the diffusion barrier layer 206 of the well region 201 away from the gate structure 203 forms the source region 204.

The source region 204 will occupy a partial region of the diffusion barrier layer 206 in the well region 201 and a partial region of the inversion layer 207, the remaining inversion layer 207 is only formed between the diffusion barrier layer 206 and the well region 201, and the source region 204 is in direct contact with the diffusion barrier layer 206. The source region 204 is in direct contact with the diffusion barrier layer 206, so that the diffusion barrier layer 206 enables the source region 204 to obtain a greater stress while preventing first type ions in the source region 204 from diffusing into the channel region, which is beneficial to improve the carrier mobility in the channel during the operation of the semiconductor structure.

With reference to FIG. 12, after the source region 204 and the drain region 205 are formed, a salicide barrier layer 208 is formed on the drift region 202 between the gate structure 203 and the drain region 205. The salicide barrier layer 208 extends to a side wall and a partial top in the gate structure 203 near the drain region 205.

In some implementations of the present disclosure, the source region 204 and the drain region 205 are formed first, and then the salicide barrier layer 208 is formed. During the formation of the salicide barrier layer 208, the salicide barrier layer 208 can accurately cover the diffusion barrier layer 206 and a partial region in the drain region 205 near the gate structure 203, so that a metal salicide layer formed subsequently cannot easily contact the diffusion barrier layer 206, thereby avoiding the problem of tip leakage in the semiconductor structure. Moreover, since the source region 204 and the drain region 205 are formed prior to the salicide barrier layer 208, the source region 204 and the drain region 205 are configured for a larger process window, so that a region formed by the source region 204 and the drain region 205 is large, and therefore, the contact resistance of the semiconductor structure is small.

It should be noted that the salicide barrier layer 208 also extends onto a partial region in the drain region 205 near the gate structure 203.

The salicide barrier layer 208 is configured to prevent the growth of a salicide layer, thereby preventing the salicide layer from being formed on the drift region 202 between the gate structure 203 and the drain region 205, preventing the salicide layer from adversely affecting the formation of a depletion region in the drift region 202, and further ensuring the withstanding voltage performance of the NLDMOS.

Specifically, a material of the salicide barrier layer 208 includes one or more of silicon oxide, silicon nitride and silicon oxynitride. In some implementations, the material of the salicide barrier layer 208 is silicon oxide.

It should also be noted that in some implementations, in the forming method of a semiconductor structure, the source region 204 and the drain region 205 are formed first, and then the salicide barrier layer 208 is formed.

In other implementations, the salicide barrier layer may be formed first, and then the source region and the drain region may be formed. The salicide barrier layer formed first can function as a mask during the subsequent formation of the source region and the drain region. Therefore, during the formation of the source region and the drain region by doping, the first type ions cannot easily enter the drift region between the gate structure and the drain region under the shield of the salicide barrier layer, so that the first type ions cannot easily diffuse into the channel region, and the depletion layer of the source region and the drain region cannot easily expand during the operation of the semiconductor structure, which is beneficial to alleviate the short-channel effect and enhance the electrical performance of the semiconductor structure.

FIG. 10 is a schematic structural diagram of one form of the semiconductor structure according to embodiments and implementations of the present disclosure. A semiconductor structure provided by one form of the present disclosure will be described in detail below in conjunction with the accompanying drawings.

With reference to FIG. 10, the semiconductor structure of one form includes: a base, where a well region 101 and a drift region 102 adjacent to each other are formed in the base; a gate structure 103, located on the base at a junction between the well region 101 and the drift region 102; a source region 104, located in the well region 101 on one side of the gate structure 103; a drain region 105, located in the drift region 102 on the other side of the gate structure 103; and a diffusion barrier layer 106, located in the drift region 102 between the drain region 105 and the gate structure 103, where the diffusion barrier layer 106 is configured to prevent doping ions in the drain region 105 from diffusing into a channel region below the gate structure 103.

In the semiconductor structure of one form of the present disclosure, the diffusion barrier layer 106 is located in the drift region 102 between the drain region 105 and the gate structure 103, and the diffusion barrier layer 106 is configured to prevent the doping ions in the drain region 105 from diffusing into the channel region below the gate structure 103. During the operation of the semiconductor structure, under the action of the diffusion barrier layer 106, the doping ions in the drain region 105 do not easily diffuse into the channel region below the gate structure 103, which makes a depletion layer of the drain region 105 not easily expand, thereby being beneficial to alleviate the short-channel effect, and further improving the electrical performance of the semiconductor structure.

In some implementations, taking an LDMOS fin field-effect transistor as the semiconductor structure as an example, the base includes a substrate 100 and fins 109 discrete on the substrate 100. In other implementations, the LDMOS may also be a planar transistor, and the corresponding base is a plane substrate.

In some implementations, the substrate 100 is a silicon substrate. In other implementations, the substrate may also be a substrate of another material such as a germanium substrate, a silicon-germanium substrate, a silicon carbide substrate, a gallium arsenide substrate, an indium-gallium substrate or the like, and the substrate may also be another type of substrate such as a silicon substrate on an insulator, a germanium substrate on an insulator or the like.

In some implementations, the fin 109 and the substrate 100 are of an integrated structure. In other implementations, the fin also may be a semiconductor layer epitaxially grown on the substrate, thereby achieving the object of accurately controlling an initial fin height.

Therefore, the material of the fin 109 is the same as the material of the substrate 100, and the material of the fin 109 is silicon. In other implementations, the material of the fin may also be a semiconductor material such as germanium, silicon-germanium, silicon carbide, gallium arsenide, indium-gallium or the like, and the material of the fin may also be different from the material of the substrate.

The semiconductor structure may further include: an isolation layer (not shown), located on the substrate 100 exposed by the fin 109.

The isolation layer is used as a shallow trench isolation (STI) structure to isolate adjacent devices.

In some implementations, a material of the isolation layer is silicon oxide. Silicon oxide is a low-cost dielectric material commonly used in the process, and has higher process compatibility, which is beneficial to reduce the process difficulty and process cost of forming the isolation layer. In addition, silicon oxide has a smaller permittivity, which is beneficial to improve the effect of the isolation layer on isolating adjacent devices. In other implementations, the material of the isolation layer may also be another dielectric material such as silicon nitride, silicon oxynitride or the like.

In some implementations, the well region 101 and the drift region 102 are located in the fin 109, and the well region 101 is in contact with the drift region 102. The well region 101 is used as a lateral diffusion region to form a channel having a concentration gradient, and the drift region 102 is configured to receive a larger partial pressure.

First type ions are formed in the drift region 102, second type ions are formed in the well region 101, and the second type ions have a conductivity type different from that of the first type ions.

Specifically, the semiconductor structure in one form is an NLDMOS, the first type ions are N-type ions, the N-type ions include one or more of phosphorus ions, arsenic ions and antimony ions, the second type ions are P-type ions, and the P-type ions include one or more of boron ions, gallium ions and indium ions.

In other implementations, when the semiconductor structure a PLDMOS, the first type ions are P-type ions, the P-type ions include one or more of boron ions, gallium ions and indium ions, the second type ions are N-type ions, and the N-type ions include one or more of phosphorus ions, arsenic ions and antimony ions.

In some implementations, the gate structure 103 is configured to control the on and off of the LDMOS channel.

Specifically, the gate structure 103 spans the fin 109 and covers a partial top wall and a partial side wall of the fin 109. In the fin 109, the region covered by the gate structure 103 is used as the channel region.

Since the LDMOS is a high-voltage device, the gate structure 103 includes: a gate dielectric layer 1031, located on a surface of the fin 109 at the junction between the well region 101 and the drift region 102; and a gate layer 1032, located on the gate dielectric layer 1031.

In some implementations, the gate structure 103 is a poly gate structure. Accordingly, a material of the gate dielectric layer 1031 is silicon oxide. A material of the gate layer 1032 is polysilicon.

In other implementations, the gate structure may also be a metal gate structure. Accordingly, the gate dielectric layer is a high-k gate dielectric layer, and the gate layer is a metal gate electrode.

In some implementations, the semiconductor structure further includes: a side wall covering 110, located on a side wall of the gate structure 103. The side wall covering 110 is configured to define a formation region of the source region 104 and is also configured to protect the side wall of the gate structure 103 during the formation of the semiconductor structure.

In some implementations, a material of the side wall covering 110 includes one or more of silicon nitride, silicon oxynitride, silicon carbide, silicon nitride carbide, boron nitride, silicon boron nitride or silicon carbon boron nitride.

The semiconductor structure also includes: a source region 104, located in the well region 101 on the other side of the gate structure 103; and a drain region 105, located in the drift region 102 on the other side of the gate structure 103.

The doping ions in the drain region 105 and the source region 104 and the doping ions in the drift region 102 have a same conductivity type, and accordingly, the source region 104 and the drain region 105 both have the first type ions.

During the operation of the semiconductor structure, the source region 104 and the drain region 105 provide a stress to the channel so as to increase the carrier mobility in the channel.

Specifically, the drain region 105 is located in the drift region 102 on one side of the gate structure 103. The source region 104 is located in the well region 101 on the other side of the gate structure 103.

In some implementations, the semiconductor structure is an NLDMOS, and the first type ions in the source region 104 and the drain region 105 are N-type ions. In other implementations, when the semiconductor structure is a PLDMOS, the first type ions in the source region and the drain region are correspondingly P-type ions.

The diffusion barrier layer 106 is located in the drift region 102 between the drain region 105 and the gate structure 103, and the diffusion barrier layer 106 is configured to prevent the first type ions in the drain region 105 from diffusing into the channel region below the gate structure 103.

In some implementations, a material of the diffusion barrier layer 106 includes silicon nitride. The silicon nitride has a high density, which makes it difficult for the first type ions in the drain region 105 to pass through the diffusion barrier layer 106 and diffuse into the channel region. Moreover, the silicon nitride is a low-cost dielectric material commonly used in the process, and has higher process compatibility, which is beneficial to reduce the process difficulty and process cost of forming the diffusion barrier layer 106. In other implementations, the material of the diffusion barrier layer may also be diamond-like carbon. The diamond-like carbon has a high density and can also make the first type ions in the drain region diffuse into the channel region.

It should also be noted that the diffusion barrier layer 106 can also provide a stress to the drain region 105, which can improve the carrier mobility in the channel during the operation of the semiconductor structure.

In some implementations, the material of the diffusion barrier layer 106 includes silicon nitride. The silicon nitride is a high-stress material, which can provide a stress to the drain region 105, which can improve the carrier mobility in the channel during the operation of the semiconductor structure. In other implementations, the material of the diffusion barrier layer is diamond-like carbon. The diamond-like carbon is a high-stress material, which can also provide a stress to the drain region, and can improve the carrier mobility in the channel during the operation of the semiconductor structure.

In some implementations, the semiconductor structure is an NLDMOS, the diffusion barrier layer 106 is configured to provide a tensile stress to the drain region 105, and stretching the channel can improve the electron mobility. In other implementations, the semiconductor structure is a PLDMOS, the diffusion barrier layer is configured to provide a compression stress to the drain region, and compressing the channel can improve the hole mobility.

It should be noted that the diffusion barrier layer 106 is also located in the well region 101 between the gate structure 103 and the source region 104.

The diffusion barrier layer 106 in the well region 101 is configured to prevent the first type ions in the source region 104 from diffusing into the channel region below the gate structure 103.

At the same time, the diffusion barrier layer 106 in the well region 101 can also provide a stress to the source region 104, which can improve the carrier mobility in the channel during the operation of the semiconductor structure.

In some implementations, a bottom end of the diffusion barrier layer 106 is lower than a bottom end of the drain region 105. By making the bottom end of the diffusion barrier layer 106 lower than the bottom end of the drain region 105, a path of the first type ions in the drain region 105 diffusing from the bottom end of the diffusion barrier layer 106 into the channel region becomes longer, so that the first type ions in the drain region 105 do not easily diffuse from the bottom end of the diffusion barrier layer 106 into the channel region below the gate structure 103, which makes the depletion layer of the drain region 105 not easily expand during the operation of the semiconductor structure, thereby being beneficial to alleviate the short-channel effect, and further improving the electrical performance of the semiconductor structure.

In addition, compared with the case that the bottom end of the diffusion barrier layer is higher than or flush with the bottom end of the drain region, the bottom end of the diffusion barrier layer 106 is lower than the bottom end of the drain region 105, which is beneficial to increase the stress of the diffusion barrier layer 106 on the source region 104 and the drain region 105, thereby improving the carrier mobility in the channel.

It should be noted that a distance between the bottom end of the diffusion barrier layer 106 and the bottom end of the drain region 105 should not be too small or too large. Generally, the source region 104 and the drain region 105 are formed in the same step. The bottom end of the source region 104 and the bottom end of the drain region 105 have approximately a same height in the fin 109. If the distance is too small, the first type ions in the drain region 105 and the source region 104 may still diffuse from the bottom end of the diffusion barrier layer 106 into the channel region below the gate structure 103, which makes the depletion layer of the drain region 105 and the source region 104 not easily expand during the operation of the semiconductor structure, thereby being not beneficial to alleviate the short-channel effect. Moreover, if the distance is too small, the stress of the diffusion barrier layer 106 on the source region 104 and the drain region 105 is small, so that it is not easy to significantly improve the carrier mobility in the channel. If the distance is too large, during the operation of the semiconductor structure, a path of the current flowing from the drain region 105 through the channel and the source region 104 becomes larger, which causes an on-resistance of the semiconductor structure to increase, thereby causing an on-current to decrease and making it difficult to improve the electrical performance of the semiconductor structure. In some implementations, the bottom end of the diffusion barrier layer is lower than the bottom end of the drain region by 10 nm to 20 nm.

It should be noted that with a direction perpendicular to an extension direction of the gate structure 103 as a lateral direction, a lateral dimension of the diffusion barrier layer 106 should not be too large or too small. The material of the diffusion barrier layer 106 is a high-stress dielectric material. If the lateral dimension of the diffusion barrier layer 106 is too large, the stress of a top of the diffusion barrier layer 106 on the source region 104 and the drain region 105 is too large, which may easily cause fracture or dislocation in the source region 104 and the drain region 105. On the one hand, this may easily cause a leakage current in the source region 104 and the drain region 105. On the other hand, during the operation of the semiconductor structure, excessive heat is easily generated at the fracture or dislocation in the source region 104 and the drain region 105, resulting in poor performance of the semiconductor structure. In addition, since the material of the diffusion barrier layer 106 is a dielectric material, a too large lateral dimension of the diffusion barrier layer 106 easily causes the on-resistance of the semiconductor structure to increase and the on-current to decrease, making it difficult to improve the electrical performance of the semiconductor structure. If the lateral dimension of the diffusion barrier layer 106 is too small, the first type ions in the source region 104 and the drain region 105 easily pass through the diffusion barrier layer 106 and diffuse into the channel region. During the operation of the semiconductor structure, this causes the depletion layer of the source region 104 and the drain region 105 to easily expand, making it difficult to alleviate the short-channel effect. In some implementations, the lateral dimension of the diffusion barrier layer 106 is 20 nm to 30 nm.

With continued reference to FIG. 10, the semiconductor structure further includes: an inversion layer 107, located between the diffusion barrier layer 106 and the drift region 102 and between the diffusion barrier layer 106 and the drain region 105. The inversion layer 107 has second type ions therein, and the second type ions have a conductivity type different from the first type ions.

The conductivity type of the second type ions is different from the conductivity type of the first type ions, and the inversion layer 107 makes the first type ions in the drain region 105 not easily diffuse into a surface of the diffusion barrier layer 106, so that during the operation of the semiconductor structure, a side wall and a bottom of the diffusion barrier layer 106 do not have the phenomenon of a leakage current. In addition, a laminated structure formed of the diffusion barrier layer 106 and the inversion layer 107 makes the first type ions in the drain region 105 not easily diffuse into the channel region, and therefore, during the operation of the semiconductor structure, the depletion layer of the drain region 105 does not easily expand, thereby being beneficial to alleviate the short-channel effect, and further being beneficial to improve the electrical performance of the semiconductor structure.

It should be noted that the inversion layer 107 is also located in the well region 101, and the inversion layer 107 in the well region 101 is located between the diffusion barrier layer 106 and the well region 101 and between the diffusion barrier layer 106 and the source region 104.

Similarly, the inversion layer 107 in the well region 101 makes the first type ions in the source region 104 not easily diffuse into the surface of the diffusion barrier layer 106 in the well region 101, so that during the operation of the semiconductor structure, the side wall and the bottom of the diffusion barrier layer 106 in the well region 101 do not have the phenomenon of a leakage current. In addition, in the well region 101, a laminated structure formed of the diffusion barrier layer 106 and the inversion layer 107 makes the first type ions in the source region 104 not easily diffuse into the channel region, and therefore, during the operation of the semiconductor structure, the depletion layer of the source region 104 does not easily expand, thereby being beneficial to alleviate the short-channel effect, and further being beneficial to improve the electrical performance of the semiconductor structure.

Specifically, a material of the inversion layer 107 includes silicon carbide, silicon or silicon-germanium having the second type ions. In some implementations, the material of the inversion layer 107 includes silicon having the second type ions. The inversion layer 107 is generally formed by a selective epitaxial growth process, the material of the fin 109 is silicon, and the material of the inversion layer 107 is silicon having the second type ions, which is beneficial to improve the formation quality of the inversion layer 107.

In some implementations, the semiconductor structure is an NLDMOS, the second type ions are P-type ions, and the P-type ions include boron ions, gallium ions or indium ions. In other implementations, the semiconductor structure is a PLDMOS, the second type ions are N-type ions, and the N-type ions include phosphorus ions, arsenic ions or antimony ions.

It should be noted that the inversion layer 107 should not be too thick or too thin. The main material of the inversion layer 107 is silicon which has a lower density than silicon nitride. If the inversion layer 107 is too thick, the inversion layer 107 will occupy too much space of the diffusion barrier layer 106, so that the space for forming the diffusion barrier layer 106 is small, resulting in a weaker barrier capability of the laminated structure formed of the inversion layer 107 and the diffusion barrier layer 106 to the first type ions, and accordingly, easily resulting in an insufficient stress of the diffusion barrier layer 106 on the drain region 105 and making it difficult to improve the carrier mobility in the channel. If the inversion layer 107 is too thin, when the first type ions in the source region 104 and the drain region 105 diffuse into the inversion layer 107, the second type ions in the inversion layer 107 are easily electrically neutralized with the first type ions, so that the first type ions in the drain region 105 diffuse into the surface of the diffusion barrier layer 106, resulting in the phenomenon of a leakage current in the side wall and the bottom of the diffusion barrier layer 106 in the well region 101. In some implementations, a thickness of the inversion layer 107 is 5 nm to 10 nm.

FIG. 12 is a schematic structural diagram of a one form of the semiconductor structure according to some implementations of the present disclosure.

The similarities of some implementations to the implementations described above are omitted here. Some implementation are different from the implementations described above in that: another schematic location diagram of the diffusion barrier layer 206 in the semiconductor structure is shown, a diffusion barrier layer 206 is in direct contact with a drain region 205, and an inversion layer 207 is located between the diffusion barrier layer 206 and a drift region 202.

In some implementations, the drain region 205 is in direct contact with the diffusion barrier layer 206, and the diffusion barrier layer 206 enables the drain region 205 to obtain a greater stress while preventing first type ions in the drain region 205 from diffusing into a channel region, which is beneficial to improve the carrier mobility in a channel during the operation of the semiconductor structure.

It should be noted that the inversion layer 207 is also located in the well region 201, the inversion layer 207 in the well region 201 is located between the diffusion barrier layer 206 and the well region 201, and the diffusion barrier layer 206 is in direct contact with the source region 204.

In some implementations, the source region 204 is in direct contact with the diffusion barrier layer 206, and the diffusion barrier layer 206 enables the source region 204 to obtain a greater stress while preventing the first type ions in the source region 204 from diffusing into the channel region, which is beneficial to improve the carrier mobility in the channel during the operation of the semiconductor structure.

The semiconductor structure includes: a salicide barrier layer 208, located on the drift region 202 between a gate structure 203 and the drain region 205. The salicide barrier layer 208 extends onto a side wall and a partial top in the gate structure 203 near the drain region 205.

It should be noted that the salicide barrier layer 208 also extends onto a partial region in the drain region 205 near the gate structure 203.

The salicide barrier layer 208 is configured to prevent the growth of a salicide layer, thereby preventing the salicide layer from being formed on the drift region 202 between the gate structure 203 and the drain region 205, preventing the salicide layer from adversely affecting the formation of a depletion region in the drift region 202, and further ensuring the withstanding voltage capability of the NLDMOS.

Specifically, a material of the salicide barrier layer 208 includes one or more of silicon oxide, silicon nitride and silicon oxynitride. In some implementations, the material of the salicide barrier layer 208 is silicon oxide.

The semiconductor structure may be formed by adopting the forming method described in the foregoing embodiments and implementations, or may be formed by adopting other forming methods. For detailed description of the semiconductor structure of some implementations, reference may be made to the corresponding description in the foregoing embodiments and implementations, and details are omitted in the present embodiment.

Although the embodiments and implementations of the present disclosure have been disclosed above, some implementations of the present disclosure are not limited thereto. A person skilled in the art may make variations and modifications without departing from the spirit and scope of some implementations of the present disclosure. Therefore, the protection scope of some implementations of the present disclosure should be subject to the appended claims.

What is claimed is:

1. A method for forming a semiconductor structure, comprising:
    providing a base, wherein the base has a well region and a drift region adjacent to the well region formed in the base, the drift region doped with first type ions;
    forming a trench in the drift region;
    after the trench is formed, forming an inversion layer on a side wall and a bottom wall of the trench, the inversion layer doped with second type ions that have a different conductivity type from the first type ions;
    after the inversion layer is formed, forming a diffusion barrier layer in the trench;
    after the diffusion barrier layer is formed, forming a gate structure on the base at a junction between the well region and the drift region, wherein the gate structure is located on a side of the diffusion barrier layer near the well region; and
    forming a source region in the well region on one side of the gate structure, and forming a drain region in the drift region on the other side of the gate structure, wherein the drain region is located on a side of the diffusion barrier layer in the drift region away from the well region;
    wherein the step of forming the inversion layer comprises:
        forming an epitaxial layer in the trench by adopting a selective epitaxial growth process, and
        during the formation of the epitaxial layer, doping the epitaxial layer with the second type ions.

2. The method for forming a semiconductor structure according to claim 1, wherein a thickness of the inversion layer is 5 nm to 10 nm.

3. The method for forming a semiconductor structure according to claim 1, wherein:
   forming the trench in the drift region comprises forming the trench in the drift region and in the well region;
   in the step of forming the gate structure, the gate structure is located between the diffusion barrier layer in the drift region and the diffusion barrier layer in the well region; and
   in the step of forming the source region, the source region is located on a side of the diffusion barrier layer in the well region away from the drift region.

4. The method for forming a semiconductor structure according to claim 1, wherein during the formation of the drain region, the drain region is in contact with the diffusion barrier layer.

5. The method for forming a semiconductor structure according to claim 1, wherein:
   the step of forming the trench comprises: forming a mask layer on the base; and
   using the mask layer as a mask, etching the base by adopting a dry etching process to form the trench.

6. The method for forming a semiconductor structure according to claim 1, wherein in the step of forming the drain region, a bottom end of the drain region is higher than a bottom end of the diffusion barrier layer by 10 nm to 20 nm.

7. The method for forming a semiconductor structure according to claim 1, wherein in the step of forming the trench, with a direction perpendicular to an extension direction of the trench as a lateral direction, a lateral dimension of the trench is 30 nm to 50 nm.

8. The method for forming a semiconductor structure according to claim 1, wherein the diffusion barrier layer is formed in the trench by adopting a high-density plasma chemical vapor deposition process or an atomic layer deposition process.

9. The method for forming a semiconductor structure according to claim 1, wherein a material of the diffusion barrier layer comprises silicon nitride or diamond-like carbon.

* * * * *